United States Patent

[11] 3,615,936

[72] Inventor Monika Batz
Heilbronn, (Neckar), Germany
[21] Appl. No. 731,945
[22] Filed May 24, 1968
[45] Patented Oct. 26, 1971
[73] Assignee Telefunken Patentverwertungsgesellschaft mbH
Ulm am Danube, Germany
[32] Priority June 1, 1967
[33] Germany
[31] T 34003

[54] SEMICONDUCTOR DEVICE AND METHOD OF MAKING THE SAME
6 Claims, 7 Drawing Figs.

[52] U.S. Cl. .......... 148/187, 29/578, 148/188
[51] Int. Cl. .......... H01l 7/44
[50] Field of Search .......... 148/187, 188; 29/578

[56] References Cited
UNITED STATES PATENTS
3,477,886 11/1969 Ehlenberger .......... 148/187
3,484,313 12/1969 Tauchi et al. .......... 148/187

*Primary Examiner*—L. Dewayne Rutledge
*Assistant Examiner*—R. A. Lester
*Attorney*—Spencer & Kaye

ABSTRACT: A semiconductor device and a method for making the same. The device includes a semiconductor body having at least one PN junction created by the diffusion of impurities into the body. The device further includes an intermediate layer arranged on the surface of the semiconductor body and made of a material having a higher diffusion constant for the diffused impurities than the semiconductor body. The method includes the steps of applying the intermediate layer to the semiconductor body, applying a masking layer, having a diffusion window opening, to the intermediate layer and diffusing the impurities into the semiconductor body, through the diffusion window and the intermediate layer.

Inventor:
Monika Batz
By Spencer & Kaye

Inventor:
Monika Batz
By Spencer & Kaye
Attorneys

SEMICONDUCTOR DEVICE AND METHOD OF MAKING THE SAME

BACKGROUND OF THE INVENTION

The present invention relates to a semiconductor device and to a manufacturing method for a semiconductor device which is made by diffusing impurities into a limited region of a semiconductor body through an opening in a masking layer located on its surface.

When PN-junctions are formed by diffusion of impurities through an opening or "diffusion window" in a masking layer on a semiconductor body, the junction will be relatively flat in the region immediately below the diffusion window and then curve sharply upward at the edges to meet the surface of the semiconductor body. These sharply curved or bent portions of the PN-junction lower the breakdown voltage of the resulting semiconductor device.

SUMMARY OF THE INVENTION

An object of the present invention, therefore, is to provide a method of making a semiconductor device by which the PN-junctions can be formed with only a slight curvature in the regions where the junction extends to the surface of the semiconductor body so that the breakdown voltage of the semiconductor device may be increased.

These as well as other objects which will become apparent in the discussion that follows are achieved, according to the present invention, by applying an intermediate layer to the surface of a semiconductor body before applying the masking layer having the opening or diffusion window, then diffusing the impurities through the opening into the intermediate layer and the semiconductor body. If the intermediate layer is made of a material having a higher diffusion constant for these impurities than does the semiconductor body, a portion of the material of diffusion will first penetrate into the intermediate layer in a direction parallel to the surface of the semiconductor body. A diffusion from the intermediate layer will then be superimposed upon the usual diffusion through the diffusion window and the PN-junction so formed will have a considerably larger radius of curvature in the regions where it meets the surface of the semiconductor body. This increased radius of curvature will, in turn, increase the breakdown voltage of the resultant semiconductor device.

The requirement that the intermediate layer—the layer between the surface of the semiconductor body and the masking layer—possess a greater constant of diffusion for the particular impurities diffused than the semiconductor body, may be met for the elements of group III*a* of the periodic table, for example, by silicon dioxide. The masking layer for these elements and, in particular, for aluminum, gallium and indium, may be made of silicon nitride. It is possible, in addition, to apply a plurality of intermediate layers, as necessary.

It is possible, by structuring the intermediate layer so that it is applied to a limited region of the surface of the semiconductor body, to further influence the shape of a PN-junction. This effect will be discussed in greater detail below in connection with the drawings.

When manufacturing a diffused semiconductor device, a structured application of the intermediate layers according to the present invention can, in addition, even supplant a diffusion window if the dimensions of the structured layer correspond to the dimensions of the conductivity zone desired and this zone is generated by diffusion through the intermediate layer. In this case the diffusion is carried out in such a way that the impurities diffuse out of the entire intermediate layer into the semiconductor body.

In general, however, the intermediate layer is applied to the entire surface of one side of the semiconductor body and allowed to remain. In this case, therefore, the intermediate layer is also located on the semiconductor body surface in the region of the diffusion window during the diffusion process. By proper choice of the thickness of the intermediate layer it is possible to control the impurity concentration of the diffused semiconductor zone.

When impurities such as aluminum, gallium and indium are used, an intermediate layer made of a properly chosen material such as silicon dioxide has the additional advantage of preventing the diffusion material from alloying with the semiconductor body.

DESCRIPTION OF THE PREFERRED EMBODIMENTS

Figure 1:
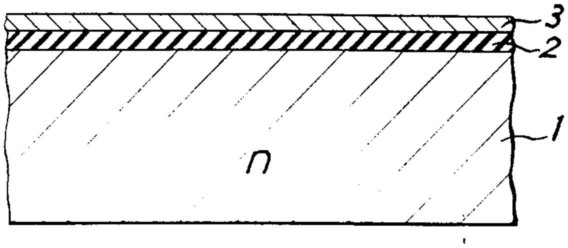
FIG. 1 is a schematic cross-sectional view of a semiconductor device in an initial stage of manufacture according to one embodiment of the present invention.
Figure 2:
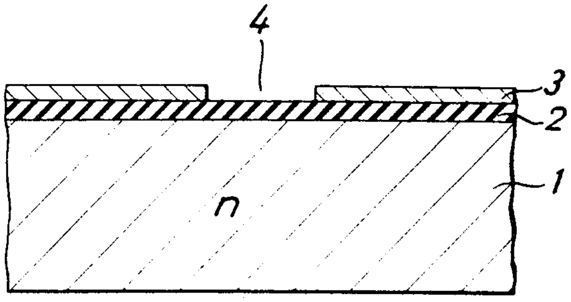
FIG. 2 is a schematic cross-sectional diagram of the semiconductor device of FIG. 1 in a second stage of manufacture.
Figure 3:
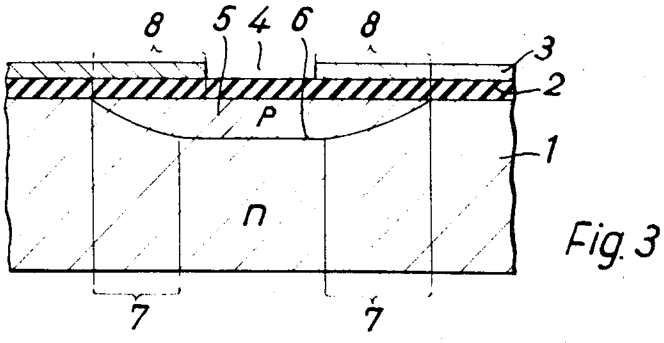
FIG. 3 is a schematic cross-sectional diagram of the semiconductor device of FIG. 1 in the third stage of manufacture.

Referring now to the drawings, FIGS. 1, 2 and 3 illustrate the manufacture of a PN-junction in a semiconductor device according to one preferred embodiment of the present invention. FIG. 1 shows a germanium semiconductor body 1 having an N-conductivity-type with an intermediate layer 2 applied to the entire surface of one side thereof. This intermediate layer 2 will be allowed to remain on the surface of the semiconductor body after the semiconductor device is completed. Like the masking layer, this intermediate layer 2 is an electrical insulator; it may be made, for example, of silicon dioxide if the impurities to be diffused are to be taken from group III*a* of the periodic table which includes boron, aluminum, gallium, indium and thallium.

A masking layer 3, for example, of silicon nitride, is applied to the surface of the intermediate layer 2. An opening or diffusion window 4 is then produced in the masking layer 3 as shown in FIG. 2. A P-conductivity zone 5, illustrated in FIG. 3, is finally diffused into the semiconductor body 1 producing the PN-junction 6.

As may be observed in FIG. 3, the PN-junction 6 will not have the sharp curvature in the region 7 that is normally found in PN-junctions formed by diffusion. The increased radius of curvature of the PN-junction is caused by the superposition of a diffusion from the region 8 of the silicon dioxide layer 2 upon the usual diffusion which takes place through the diffusion window 4. Because of the high-diffusion constant of the intermediate layer 2, a portion of the impurities penetrating from the outside through the opening 4 diffuse sideways or longitudinally along the intermediate layer 2 before diffusing downward into the semiconductor body 1.

By preventing the PN-junction from forming a sharp bend in its edge region where it reaches up to the surface of the semiconductor body 1, the present invention provides a way to increase the blocking or breakdown voltage of the PN-junction. The present invention has the additional advantage that the silicon dioxide intermediate layer 2 prevents the alloying of materials such as aluminum, gallium and indium with the semiconductor material.

Figure 4:
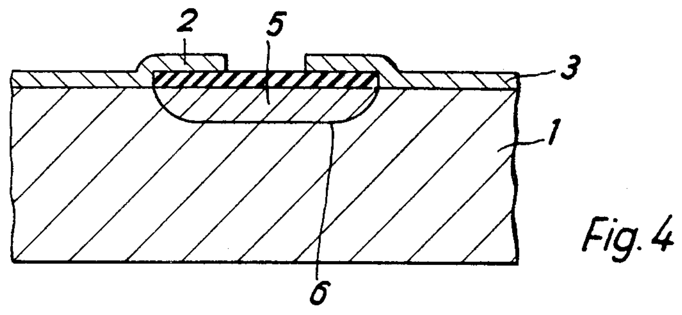
FIG. 4 is a schematic cross-sectional diagram of a semiconductor device in an initial stage of manufacture according to a second embodiment of the present invention.
Figure 5:
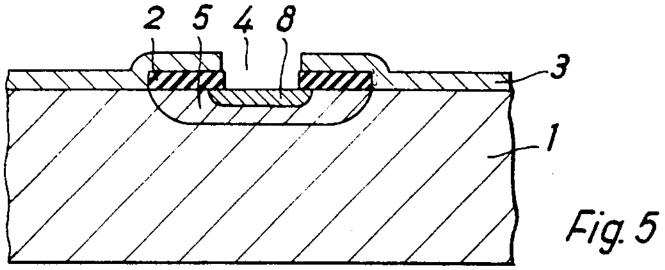
FIG. 5 is a schematic cross-sectional diagram of the semiconductor device of FIG. 4 in a second stage of manufacture.

FIGS. 4 and 5 illustrate a method of manufacturing semiconductor devices according to a second embodiment of the present invention. In this embodiment the intermediate layer is applied in a structured fashion to only a limited region of the surface of the semiconductor body 1. A masking layer is then applied thereto in the normal fashion with the diffusion window located in the region above the intermediate layer. Since the intermediate layer 2 does not extend as far beneath the masking layer 3 in FIG. 4 as it does in the arrangement shown in FIG. 3, when the PN-junction is created by diffusion, it too will not extend outward as far as in the arrangement of FIG. 3. In other words, by limiting the region to which the intermediate layer 2 is applied, it is possible to increase the curvature of the PN-junction, as desired.

FIG. 5 shows how the two-zone semiconductor device of FIG. 4 may be turned into a semiconductor device having three zones. An additional N-conductivity zone 8 is diffused into the P-conductivity zone 5 to produce a device having two PN-junctions. The same diffusion window 4 which was used to create the P-conductivity zone 5 is used again to create the N-conductivity zone 8; however, in the latter case, the window 4 is etched all the way down to the surface of the semiconductor body 1. Since the intermediate layer 2 of silicon dioxide is not permeable to impurities taken from group V of the periodic table it, too, functions as an effective mask. In the diffusion of the N-conductivity zone 8 no diffusion from the intermediate layer 2 will be superimposed upon the diffusion through the diffusion window 4.

Whereas the semiconductor device of FIG. 4 may be employed as a diode, the device shown in FIG. 5 may be used as a transistor. The base portion of the semiconductor body 1 will in this case form the collector region, the P-conductivity zone 5 the base region and the N-conductivity zone 8 the emitter region of the transistor.

If the silicon nitride layer which is used as a masking layer is not too thick but measures, say, only 500 Angstroms in thickness, the standard photoresist mask will suffice as an etching mask in the manufacture of the diffusion window. If the silicon nitride layer is thicker, however, it is necessary to use a silicon dioxide layer as the etching mask. This silicon dioxide layer may be allowed to remain on the finished semiconductor device. In this case, a hot phosphoric acid solution may serve as an etching agent instead of the buffered hydrofluoric acid which is commonly used with photoresist masks.

Figure 6:
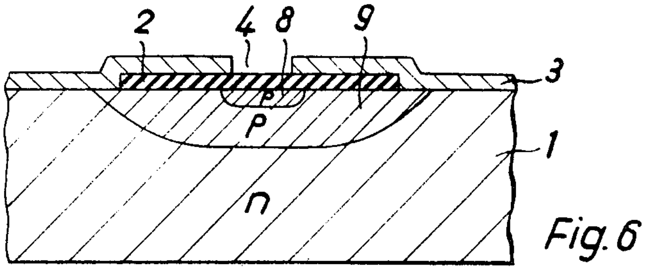
FIG. 6 is a schematic cross-sectional diagram of a semiconductor device in an initial stage of manufacture according to a third embodiment of the present invention.
Figure 7:
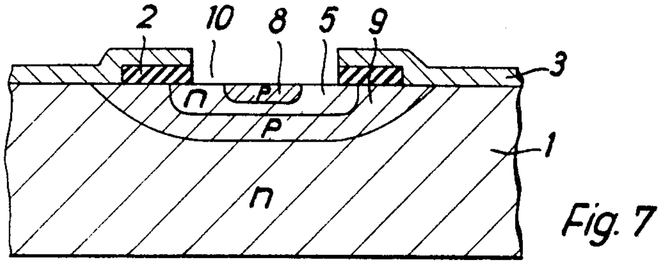
FIG. 7 is a schematic cross-sectional diagram of the semiconductor device of FIG. 6 in a second stage of manufacture.

FIGS. 6 and 7 illustrate still another embodiment of the present invention wherein the collector zone of a PNP-transistor is electrically insulated from the base material of the semiconductor body. This kind of electrical insulation with respect to the base portion of the semiconductor body is required, for example, in integrated circuits.

To manufacture this type of transistor, a structured intermediate layer 2 of silicon dioxide is applied, for example, to an N-conductivity-type germanium semiconductor body 1. The surface area of the intermediate layer applied is made as large as the cross-sectional area of the collector zone desired. A masking layer 3 of silicon nitride is then applied to the intermediate layer 2 and provided with an emitter diffusion window 4.

To create the collector zone 9, indium is diffused into the semiconductor body 1 through the emitter window 4 and through the intermediate layer 2. The semiconductor body 1 may consist, for example, of a 3 ohm$^{11}$cm.$^{11}$ host crystal of the N-conductivity type. If the indium diffusion is carried out with the concentration for example, of 5-$10^{15}$ impurities per cm.$^{3}$, there is produced, in the semiconductor body 1, a P-zone 9 with a conductivity of approximately 1 ohm$^{11}$cm.$^{11}$.

After the manufacture of the collector zone 9 the emitter zone is manufactured in a similar manner by diffusing gallium into the semiconductor body through the emitter diffusion window 4. The gallium diffusion, which is flatter than the indium diffusion, is effected with a higher concentration, for example, of 1-$10^{20}$ impurities per cm.$^{3}$.

When the emitter zone 8 is completed a base diffusion window 10 is etched into the silicon nitride layer 3 as well as the silicon dioxide layer 2. The base zone 5 is then created by the diffusion of impurities from group V of the periodic table into the semiconductor body through the base diffusion window 10 creating the PNP-transistor shown in FIG. 7. This technique of carrying out the base diffusion subsequent to the emitter diffusion is especially well suited for the manufacture of monolithic integrated circuits.

It will be understood that the above description of the present invention is susceptible to various modifications, changes and adaptations, and the same are intended to be comprehended within the meaning and range of equivalents of the appended claims.

I claim:

1. A method for diffusing selected impurities into a limited region of a semiconductor body comprising the steps of:

a. applying an intermediate layer of a material having a higher diffusion constant for said selected impurities than said semiconductor body to only a defined portion of one surface of the semiconductor body corresponding to the desired cross-sectional surface area of the semiconductor zone to be formed by the diffusion;

b. applying a masking layer which is substantially impervious to said selected impurities to said surface of said semiconductor body and to the surface of said intermediate layer, said masking layer having an opening which overlies a portion of said defined portion of one surface of the semiconductor body; and C. diffusing said impurities into said semiconductor body through said opening and said intermediate layer.

2. The method defined in claim 1, wherein said impurities are selected from group III*a* of the periodic table.

3. The method defined in claim 2, wherein said intermediate layer is silicon dioxide and said masking layer is silicon nitride.

4. The method as defined in claim 1 wherein said intermediate layer covers the portion of said surface of said semiconductor body underlying said opening in said masking layer during said diffusion step.

5. The method as defined in claim 1 wherein when said method is used in the production of a transistor, said defined portion of one surface of said semiconductor body corresponds to the cross-sectional area of the base zone.

6. The method as defined in claim 1 wherein when said method is used in the production of a transistor whose collector zone is electrically insulated from the remainder of said semiconductor body, said defined portion of one surface of said semiconductor body corresponds to the cross-sectional area of the collector zone.

* * * * *